United States Patent [19]

Majid

[11] Patent Number: 5,687,065
[45] Date of Patent: Nov. 11, 1997

[54] PRE-REGULATOR WITH LIGHT SWITCH TO LIMIT VOLTAGE RINGING ON TURN-OFF

[75] Inventor: Naveed Majid, Mohegan Lake, N.Y.

[73] Assignee: Philips Electronics North America Corporation, New York, N.Y.

[21] Appl. No.: 345,167

[22] Filed: Nov. 28, 1994

[51] Int. Cl.[6] .................................................. H02P 13/26
[52] U.S. Cl. .............................. 363/89; 323/224; 363/86
[58] Field of Search .............................. 363/21, 44, 89, 363/98, 125; 323/222

[56] References Cited

U.S. PATENT DOCUMENTS

| | | | |
|---|---|---|---|
| 4,683,529 | 7/1987 | Bucher, II | 363/44 |
| 4,989,058 | 1/1991 | Colak et al. | 357/23.8 |
| 5,253,156 | 10/1993 | Sakurai et al. | 363/98 |
| 5,301,095 | 4/1994 | Teramoto et al. | 363/21 |
| 5,371,667 | 12/1994 | Nakao et al. | 363/124 |
| 5,406,192 | 4/1995 | Vinciarelli | 323/222 |
| 5,436,824 | 7/1995 | Royner et al. | 363/89 |
| 5,469,046 | 11/1995 | Wong et al. | 323/286 |

FOREIGN PATENT DOCUMENTS

| | | |
|---|---|---|
| 0380881 | 8/1990 | European Pat. Off. . |
| 0490079 | 6/1992 | European Pat. Off. . |
| 0622889A2 | 11/1994 | European Pat. Off. ....... H02M 3/156 |

*Primary Examiner*—Peter S. Wong
*Assistant Examiner*—Rajnikant B. Patel

[57] ABSTRACT

A power integrated circuit pre-regulator AC/DC converter circuit which employs a slow turn-off lateral insulated gate bipolar transistor (LIGBT) device as the switching transistor so as to reduce the decay time of a current generated by the parasitic inductance in the circuit upon turn-off of the LIGBT device, thereby to substantially reduce the level of a ringing voltage produced at the drain of the LIGBT device.

12 Claims, 2 Drawing Sheets

PRE-REGULATOR WITH LIGHT SWITCH TO LIMIT VOLTAGE RINGING ON TURN-OFF

BACKGROUND OF THE INVENTION

The present invention relates to power supply circuits and, more particularly, to a switching pre-regulator power integrated circuit which is protected against harmful voltage ringing upon turn-off of the switching power transistor.

A major problem in switching type pre-regulator circuits is that a large voltage ring or oscillation occurs at the drain of the switching power field effect transistor (FET) device upon turn-off of the FET device. This problem is especially acute when there is an inductance in the circuit, either in the form of a discrete inductor or the ever present parasitic inductance common to these types of circuit. At the same time, the power FET device exhibits a parasitic capacitance between its drain and source electrodes. When the power FET device is turned off, the current through the inductor or parasitic inductance cannot drop to zero instantly and so it generates a large voltage ring (oscillation) at the drain of the power FET device. This ringing voltage can often be large enough to destroy the power FET device.

One common technique for solving this voltage ringing problem is to provide a so-called snubber circuit in order to reduce the voltage ring on turn-off of the power field effect transistor device. In its simplest form, the snubber circuit consists of a resistor and capacitor connected in series circuit between the drain and source electrodes of the FET device. However, the additional components, resistor and capacitor, add to the cost of the circuit and also increase the switching losses in the circuit.

The European Patent Application 0 380 881 describes a protection circuit for a power MOSFET which drives an inductive load. This snubber circuit, comprising two stages, regulates the gate current of a MOSFET in relation to the drain-to-source voltage at turn-off so as to clamp transient inductive voltages to a non-destructive level. At the onset of the turn-off, a current source is activated to discharge the gate capacitance and the snubber circuit controls the magnitude of such current in relation to the sensed drain-to-source voltage so as to stabilize this voltage at a non-destructive level. When the drain-to-source voltage approaches its limit value, a current injection circuit supplies additional current to the gate so as to sustain conduction in the MOSFET, again in relation to the sensed drain-to-source voltage. When the inductive energy stored in the load is substantially dissipated, the drain-to-source voltage falls, the current injection circuit is disabled and the conduction of the current source is increased to complete the turn-off of the MOSFET. As can be seen, the complexity and cost of this solution makes it rather unattractive in a competitive market.

The use of a pre-regulator circuit also provides an attractive alternative to conventional switch mode power supplies (SMPS) because it avoids the use of inductive components, although some small parasitic inductance may still be present. Furthermore, since the pre-regulator circuit does not utilize a high-frequency switching transistor, it develops a much lower EMI. However, prior art pre-regulator circuits for power supply applications typically are difficult to integrate because it is hard to achieve accurate low power sensing at high voltages and because peak switching currents as high as 10 amps can appear in the circuit.

SUMMARY OF THE INVENTION

An object of the present invention is to provide an integrated circuit (IC) low cost pre-regulator circuit which provides AC to DC conversion and which uses relatively few components and produces relatively low levels of EMI noise.

Another object of the invention is to provide a pre-regulator circuit which effectively suppresses, or at least substantially reduces, the ringing voltage that otherwise occurs upon turn-off of the switching power FET device in the circuit.

A further object of the invention is to provide a single chip IC AC to DC converter that is a low cost, compact alternative to conventional switched mode power supplies.

A still further object of the invention is to provide a pre-regulator power IC that can supply a wide range of supply voltages to a variety of load circuits, including but not limited to television receivers, DC motors and halogen lamps.

Another object of the invention is to provide a power integrated circuit that provides a regulated variable DC output voltage operative with a wide range of input line voltages and with high efficiency and low EMI.

A further object of the invention is to provide a power integrated circuit AC/DC converter in which the control circuit and the power device are integrated on a single chip IC and which avoids the use of inductive components.

The invention makes it possible to realize a low cost single chip IC variable output pre-regulator circuit that switches at only 120 Hz and which does not use an inductor.

The above and other objects and advantages can be achieved by means of an integrated circuit power supply apparatus that substantially reduces any voltage ring across the switching power device by using a slow turn-off lateral insulated gate bipolar transistor (LIGBT) as the switchable power device. The invention is based upon the recognition that the slow turn-off characteristic of a LIGBT device provides a simple and inexpensive expedient to the problem of reducing the amplitude of the ringing voltage that normally occurs on turn-off of the power device. The current in a slow turn-off LIGBT device drops off to zero slowly, thereby allowing the current through the parasitic inductance to decay slowly to zero, which in turn reduces the level of any voltage ring at the drain of the LIGBT device.

The novel insight which underlies the present invention can be utilized to good effect in a low power pre-regulator power supply circuit such as that described in a copending U.S. application Ser. No. 08/055,655, filed Apr. 30, 1993, and which is assigned to the assignee of the present U.S. application. This copending U.S. application is hereby incorporated by reference into the present U.S. application. One form of LIGBT device having the required characteristics to accomplish the objects of this invention is described in U.S. Pat. No. 4,989,058 (Jan. 29, 1991), and which also is hereby incorporated by reference into this U.S. application.

The pre-regulator circuit of the aforesaid copending U.S. application includes a load capacitor in series with a switching power device, in that case a field effect transistor. The capacitor voltage is differentially sensed by a control circuit which turns off the power device when the capacitor voltage reaches a predetermined voltage level. If there is any parasitic inductance in the drain circuit of the FET power device, a large voltage ring will appear at the drain of the FET power device when it is turned off. The use of an LIGBT device, such as that described in U.S. Pat. No. 4,989,058, or other device with a similar slow turn-off characteristic in place of the FET power device will correct or substantially reduce the voltage ring which otherwise would occur upon turn-off of the FET power device.

In order to minimize the area of an integrated circuit incorporating the invention, a high density 500 volt LIGBT device which can deliver a peak current of 10 A with a very low on-resistance of about 0.33 ohms at a low on voltage of 3 volts is available for use. In the case of an on voltage of only 3 V, the power dissipation in a 150 watt system requiring 1 A of current is only 3 W, resulting in an efficiency of 98%.

BRIEF DESCRIPTION OF THE DRAWINGS

The above and other objects, features and advantages of the present invention will be better understood from the following detailed description when taken in conjunction with the accompanying drawings, in which.

DESCRIPTION OF THE PREFERRED EMBODIMENTS

Figure 1:
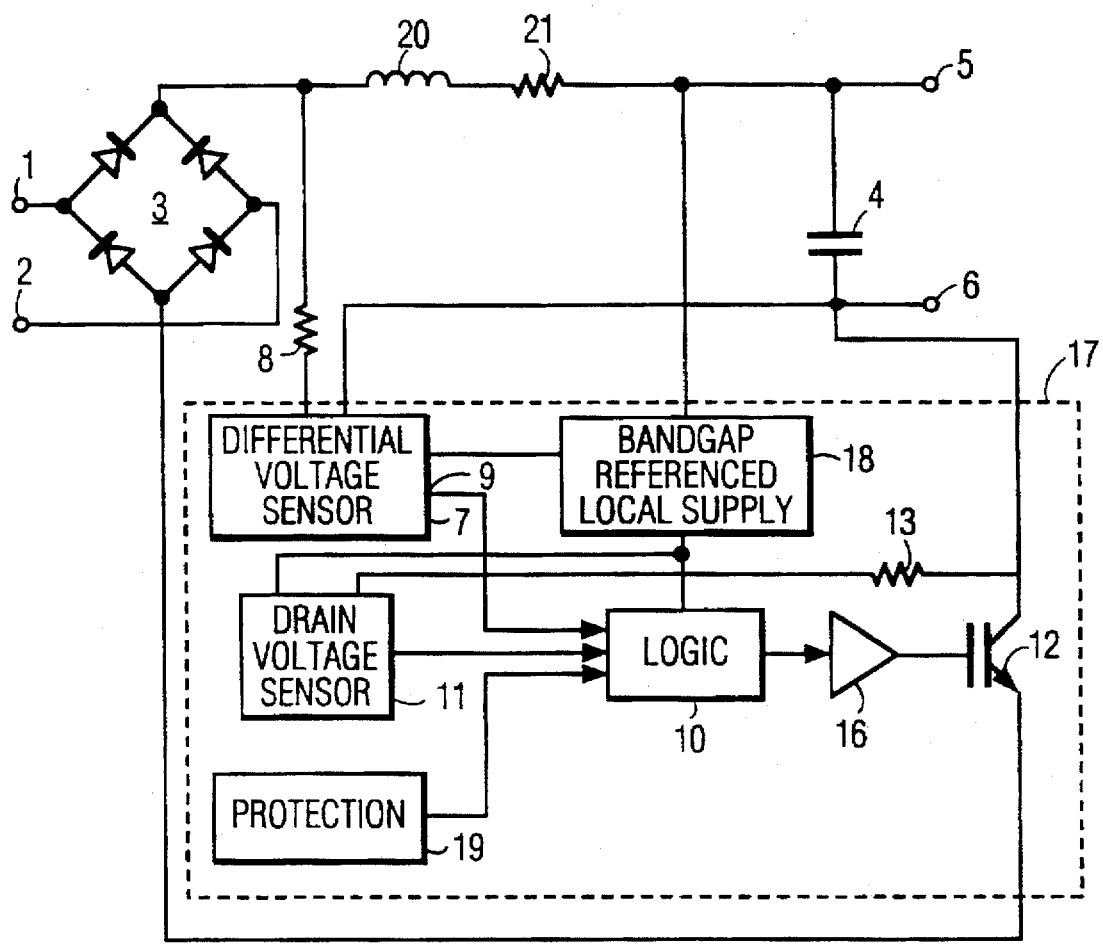
FIG. 1 illustrates in partial block diagram form a preferred embodiment of the present invention.

FIG. 1 of the drawing shows a diagram of a preferred embodiment of the invention, incorporated into a power IC pre-regulator circuit of the type described in detail in copending U.S. application Ser. No. 08/055,655 (filed Apr. 30, 1993). The pre-regulator circuit receives a sinusoidal AC input voltage of 115 V, 60 Hz (or a 50 Hz voltage) at a pair of input terminals 1, 2. This AC voltage is applied to a pair of input terminals of a full wave rectifier bridge circuit 3 at whose output terminals a full wave rectified DC voltage is developed. This DC voltage is applied to an output filter capacitor 4. An output voltage is available for a load circuit (not shown) at the DC supply voltage output terminals 5, 6, which are coupled to the output capacitor. The circuit is readily adaptable for use with a variety of loads, such as a TV receiver, a DC motor, a halogen lamp, etc.

A differential voltage sensor circuit 7 has a first high voltage input terminal coupled to DC output terminal 5 via a series connected resistor 8 and has a second high voltage input terminal directly coupled to the output terminal 6. The input of the differential voltage sensor thus is connected in parallel with the filter capacitor 4. The differential voltage sensor is preferably constructed in the manner described in copending U.S. application Ser. No. 08/051,141, filed Apr. 22, 1993 and assigned to the assignee of the present U.S. application, but is not limited to that topology. This copending U.S. application is hereby incorporated by reference into the present U.S. application. The output 9 of the differential voltage sensor circuit 7 is coupled to a first input of a logic circuit 10.

A drain voltage sensor circuit 11 has its input coupled to the drain electrode of a power switching transistor 12 via a resistor 13 and has its output coupled to a second input of the logic circuit 10. One suitable circuit for monitoring the drain voltage of a transistor is described in copending U.S. application Ser. No. 08/055,651, filed Apr. 30, 1993, and hereby incorporated by reference. This copending U.S. application also is assigned to the assignee of the present U.S. application. The copending U.S. application Ser. No. 08/055,655 mentioned above also includes a differential voltage sensor circuit and a drain voltage sensor circuit suitable for use in this invention.

A high voltage surge sensor circuit (not shown) may be provided in order to sense a voltage surge due to a lightning strike on the supply line. The input of this circuit would then be coupled via a resistor to the line connecting one output terminal of the rectifier circuit 3 to the DC output terminal 5. The output of the voltage surge sensor circuit would be connected to a further input of the logic circuit 10. The voltage surge sensor circuit would monitor the supply voltage and if it sensed a large voltage surge, it would turn on the power switch 12 thereby to connect the large filter capacitor 4 across the supply lines. The filter capacitor would then absorb the energy due to the lightning strike.

In accordance with the invention, the power switch 12 consists of a lateral insulated gate bipolar transistor (LIGBT) device which is characterized by its slow turn-off characteristic. This device can be a transistor as described in U.S. Pat. No. 4,989,058 (Jan. 29, 1991). The LIGBT device 12 is connected in series circuit with the output capacitor 4 across the DC output terminals of the full-wave rectifier circuit 3. The gate electrode of the LIGBT device 12 is triggered by a drive signal applied to it from the output of the logic circuit 10 via a drive amplifier 16.

The switchable power device 12 and the control circuits therefor may be conveniently integrated on a single power IC chip illustrated diagrammatically by the dashed box 17 in the drawing. The power supply for the circuit elements of the power IC 17 is derived from a temperature compensated bandgap reference voltage regulator 18 which produces, for example, a 7.5V DC voltage supply. The power IC may also include an on-chip temperature protection circuit 19 having an output coupled to a further input of the logic circuit.

The apparatus shown in the drawing can operate as a 500V pre-regulator power IC which converts AC voltages from 30V to 260V at input terminals 1, 2 into DC voltages in the range of 24V to 150V for operation of a load connected to output terminals 5, 6. The load can include a TV receiver, a DC motor, etc. The LIGBT device 12 then operates as a 10 amp power switch.

The full wave diode bridge circuit 3 rectifies the AC supply voltage. The output voltage at terminals 5,6 is continuously monitored by the on-chip differential voltage sensor circuit 7. The differential voltage sensor circuit senses the differential output voltage at terminals 5, 6 during the time when the input voltage is rising and produces a control signal that is applied to the gate of the LIGBT device 12 via logic circuit 10 and driver amplifier 16. This control signal turns the power switch 12 off when a predetermined output voltage is reached. The power switch remains off until the next input voltage cycle, when the output capacitor 4 is recharged by turning on the power switch 12. As a result, the capacitor is recharged about once every eight ms, and the output maintains a constant voltage whose ripple is determined by the size of the capacitor and the value of the load current. The capacitor supplies the load current when the power switch 12 is off. The DC output voltage is limited to the predetermined value of the output voltage for an Ac input voltage variation of 30V to 260V. Good output voltage regulation is obtained because the control circuit is regulated by sensing the output voltage.

The drain voltage sensor circuit 11 senses the voltage at the drain of the LIGBT power switch 12 when the input voltage is falling and supplies a second control signal to the gate of the power switch via the logic circuit 10 and driver amplifier 16. The latter control signal turns the power switch on again when the input voltage reaches a safe turn-on level.

In order to replenish the charge on the capacitor that is lost to the load during the time when the power switch 12 is off, the power switch must be able to draw peak currents as high as 10 A in just a fraction of the AC cycle period. The LIGBT device is ideal in the case of low frequency operation since it is a high current density device with a low on-resistance value and has a relatively slow turn-off characteristic.

The bandgap reference voltage regulator 18 can tap off its input voltage from output terminal 5 of the apparatus. The voltage regulator 18 supplies, for example, a 7.5 volt DC supply voltage to the various circuits on the power IC chip 17, such as the differential voltage sensor, the drain voltage sensor, etc.

Although the output of the diode bridge rectifier circuit 3 is directly connected to the output capacitor 4 and to the output terminal 5, there is nevertheless a small parasitic inductance and a small supply line resistance in the circuit, which are represented by the inductor 20 and the resistor 21 in the drawing. This parasitic inductance is the main cause of the voltage ringing which occurs on turn-off of the power switch 12.

FIG. 2 shows some typical voltage and current waveforms of the turn-off operation. These waveforms provide a comparison of the gate voltage of the power device, the drain current through the power device, and the drain voltage of the power device when a prior art fast turn-off device (e.g. LDMOS) is used and when a slow turn-off LIGBT device is used as the power switch in accordance with the present invention. FIGS. 2A, 2B and 2C show the gate voltage, drain current and drain voltage, respectively, as a function of time (t) for a fast turn-off LDMOS switching power transistor. As shown in FIG. 2C, a large ringing or oscillation voltage appears at the drain of the LDMOS power switch when it turns off.

Figure 2A:
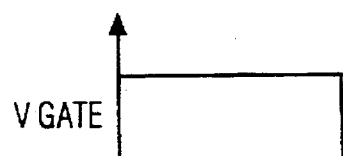
FIG. 2 illustrates voltage and current waveforms that help to elucidate the advantages of the invention.
Figure 2B:
Figure 2C:
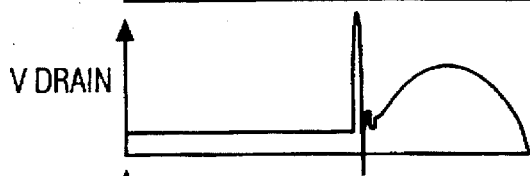
Figure 2D:
Figure 2E:
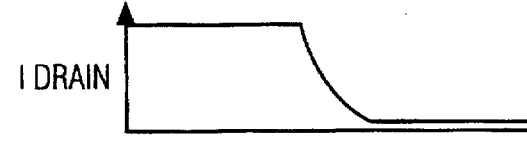
Figure 2F:

FIGS. 2D, 2E and 2F show the corresponding waveforms of gate voltage, drain current and drain voltage, respectively, when a slow turn-off LIGBT device is used as the power switch. As can be seen in FIG. 2E, the drain current decreases relatively slowly upon turn-off of the LIGBT device, resulting in a very substantial reduction in the amplitude of the ringing voltage developed at the drain of the LIGBT device (FIG. 2F). Thus, the current in the slow turn-off LIGBT device goes to zero relatively slowly, which allows the energy in the parasitic inductance 20 to gradually decay to zero thereby reducing the voltage ring at the drain of the LIGBT switching device 12.

The provision of a slow turn-off LIGBT device operating at a low frequency as the power switching device in a pre-regulator circuit results in a power integrated circuit AC to DC converter circuit (pre-regulator) having a high efficiency and low EMI, and providing good regulation for a 1 A load current with a variable DC output voltage from 24V to 150V and with an AC input voltage range of from 30V to 260V. An IC pre-regulator AC/DC converter circuit in accordance with the invention was tested in a 13 inch TV receiver and exhibited much lower EMI noise, especially above 6 MHz, than a conventional high frequency switch mode power supply.

Although the invention has been particularly shown and described with reference to a preferred embodiment thereof, it should be understood by those skilled in the art that various changes in form and detail may be made without departing from the spirit and scope of the invention.

What is claimed is:

1. An AC/DC converter circuit comprising:
    a pair of input terminals for connection to a source of AC supply voltage for the converter circuit,
    a pair of DC output terminals for supplying a load adapted to be coupled to said output terminals,
    a rectifier circuit coupled between the input terminals and the output terminals,
    a load capacitor coupled to said output terminals,
    a slow turn-off switching transistor connected in series circuit with the load capacitor to output terminals of the rectifier circuit, and
    a control circuit having an output coupled to a control electrode of the switching transistor to supply a control signal that will turn off the switching transistor at a predetermined level of the output voltage.

2. The AC/DC converter circuit as claimed in claim 1 wherein said slow turn-off switching transistor comprises a lateral insulated gate bipolar transistor (LIGBT) device.

3. The AC/DC converter circuit as claimed in claim 2 wherein said control circuit comprises:
    a differential voltage sensor having an input coupled to said load capacitor and an output coupled to the control electrode of the LIGBT device, and
    a drain voltage sensor coupled to the drain electrode of the LIGBT device and an output coupled to the control electrode thereof.

4. The AC/DC converter circuit as claimed in claim 1, said circuit having a parasitic inductance that normally produces a large ringing voltage at the drain electrode of the switching transistor, said slow turn-off transistor being responsive to said control signal to slow the decay of current therein and thereby slow the decay of current in the parasitic inductance so as to reduce the level of the ringing voltage on turn-off of the switching transistor.

5. The AC/DC converter circuit as claimed in claim 4, wherein said slow turn-off switching transistor comprises a LIGBT device.

6. The AC/DC converter circuit as claimed in claim 2, wherein said control circuit comprises:
    a differential voltage sensor having an input coupled to said load capacitor and an output coupled to the control electrode of the LIGBT device, and
    a drain voltage sensor coupled to the drain electrode of the LIGBT device and an output coupled to the control electrode thereof.

7. The AC/DC converter circuit as claimed in claim 6, wherein said control circuit further comprises a logic circuit coupled between the respective outputs of the differential voltage sensor and the drain voltage sensor and the control electrode of the slow turn-off switching transistor.

8. A switching power supply circuit comprising:
    a pair of input terminals for connection to a source of supply voltage for the converter circuit,
    a pair of output terminals for supplying a load adapted to be coupled to said output terminals,
    a load capacitor coupled between said output terminals,
    a slow turn-off switching transistor,
    means coupling said switching transistor to the load capacitor so that the switching transistor controls the flow of current in said load capacitor, and
    a control circuit having an input coupled to said load capacitor and an output coupled to a control electrode of the switching transistor to supply a control signal that will turn off the switching transistor at a predetermined level of the output voltage, said slow turn-off transistor being responsive to said control signal to slow the decay of current therein so as to reduce the level of a ringing voltage at one main electrode of the switching transistor on turn-off thereof.

9. The switching power supply circuit as claimed in claim 8 wherein said slow turn-off switching transistor comprises a lateral insulated gate bipolar transistor (LIGBT) device.

10. The AC/DC converter circuit as claimed in claim 1 wherein said control circuit supplies a control signal that will turn the switching transistor on and off at least twice in each cycle of the AC supply voltage.

11. The switching power supply circuit as claimed in claim 8 wherein said control circuit is controlled by the voltage developed across the load capacitor so as to derive the control signal for supply to the control electrode of the switching transistor.

12. The switching power supply circuit as claimed in claim 9 wherein the slow turn-off of the LIGBT device causes its drain current to decrease gradually with time in a manner approximating the waveform in FIG. 2E of the drawing.

* * * * *

UNITED STATES PATENT AND TRADEMARK OFFICE
CERTIFICATE OF CORRECTION

PATENT NO. : 5,687,065
DATED : November 11, 1997
INVENTOR(S) : Naveed Majid

It is certified that error appears in the above-identified patent and that said Letters Patent is hereby corrected as shown below:

On the title page and column 1, line 1

In the Title, change "LIGHT" to --LIGBT--.

Signed and Sealed this

Tenth Day of February, 1998

Attest:

BRUCE LEHMAN

Attesting Officer

Commissioner of Patents and Trademarks